(12) United States Patent
Xia et al.

(10) Patent No.: US 11,024,942 B2
(45) Date of Patent: Jun. 1, 2021

(54) ANTENNA-IN-PACKAGE SYSTEM AND MOBILE TERMINAL

(71) Applicant: AAC Technologies Pte. Ltd., Singapore (SG)

(72) Inventors: Xiaoyue Xia, Shenzhen (CN); Zhimin Zhu, Shenzhen (CN); Wei Zhao, Shenzhen (CN); Chao Wang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 42 days.

(21) Appl. No.: 16/524,090

(22) Filed: Jul. 28, 2019

(65) Prior Publication Data
US 2020/0052372 A1 Feb. 13, 2020

(30) Foreign Application Priority Data
Aug. 12, 2018 (CN) .......................... 201810910591.4

(51) Int. Cl.
| | |
|---|---|
| *H01Q 1/22* | (2006.01) |
| *H01L 23/66* | (2006.01) |
| *H01Q 1/40* | (2006.01) |
| *H01Q 9/04* | (2006.01) |
| *H01L 23/498* | (2006.01) |
| *H04B 1/3827* | (2015.01) |

(52) U.S. Cl.
CPC ........... *H01Q 1/2283* (2013.01); *H01L 23/66* (2013.01); *H01Q 1/40* (2013.01); *H01Q 9/045* (2013.01); *H01Q 9/0464* (2013.01); *H01L 23/498* (2013.01); *H01L 2223/6677* (2013.01); *H04B 1/3827* (2013.01)

(58) Field of Classification Search
CPC ........ H01Q 1/2283; H01Q 1/40; H01Q 9/045; H01Q 9/0464; H01Q 21/08; H01Q 9/0457; H01Q 1/243; H01Q 21/065; H01Q 21/0075; H01Q 1/22; H01Q 1/38; H01Q 1/50; H01Q 21/0006; H01L 23/66; H01L 23/498; H01L 2223/6677; H01L 2224/16227; H01L 2924/15321; H01L 2924/15192; H04B 1/3827
USPC ....................................................... 343/905
See application file for complete search history.

(56) References Cited

U.S. PATENT DOCUMENTS

| | | | |
|---|---|---|---|
| 2003/0103006 A1* | 6/2003 | Yamada | H01L 23/66 343/700 MS |
| 2006/0017157 A1* | 1/2006 | Yamamoto | H05K 1/0243 257/728 |

(Continued)

*Primary Examiner* — Don P Le
(74) *Attorney, Agent, or Firm* — W&G Law Group LLP

(57) ABSTRACT

The present disclosure provides an antenna-in-package system and a mobile terminal. The mobile terminal includes a main board, wherein the antenna-in-package system includes a substrate, a metal antenna provided on a side of the substrate facing away from the main board, an integrated circuit chip provided on a side of the substrate facing towards the main board, a feeding network provided in the substrate and spaced apart from the metal antenna, and a circuit connecting the feeding network with the integrated circuit chip. The circuit is electrically connected to the main board. The feeding network is provided with a slit at a position corresponding to the metal antenna. The metal antenna is fed with power by coupling with the feeding network via the slit.

8 Claims, 7 Drawing Sheets

(56) References Cited

U.S. PATENT DOCUMENTS

| | | | |
|---|---|---|---|
| 2006/0033664 A1* | 2/2006 | Soler Castany | H01Q 1/36 |
| | | | 343/700 MS |
| 2007/0052589 A1* | 3/2007 | Liu | H01Q 9/0421 |
| | | | 343/700 MS |
| 2008/0023810 A1* | 1/2008 | Yamazaki | G06K 19/0775 |
| | | | 257/679 |
| 2010/0090903 A1* | 4/2010 | Byun | H01Q 13/18 |
| | | | 343/700 MS |
| 2011/0050534 A1* | 3/2011 | Shimayama | H01P 5/028 |
| | | | 343/850 |
| 2012/0062439 A1* | 3/2012 | Liao | H01Q 1/526 |
| | | | 343/841 |
| 2015/0349424 A1* | 12/2015 | Hur | C04B 35/26 |
| | | | 343/788 |
| 2017/0222316 A1* | 8/2017 | Mizunuma | H01Q 21/062 |
| 2017/0229769 A1* | 8/2017 | Yokoyama | H01L 21/78 |
| 2018/0205155 A1* | 7/2018 | Mizunuma | H01Q 21/0025 |
| 2018/0337456 A1* | 11/2018 | Liu | H01Q 9/0414 |
| 2019/0191597 A1* | 6/2019 | Han | H01L 23/66 |
| 2020/0153086 A1* | 5/2020 | Park | H01Q 5/307 |
| 2020/0161766 A1* | 5/2020 | Liu | H01Q 1/2258 |
| 2020/0169007 A1* | 5/2020 | Song | H01Q 21/293 |
| 2020/0274231 A1* | 8/2020 | Wei | H01Q 5/364 |
| 2020/0274250 A1* | 8/2020 | Gu | H01Q 1/22 |
| 2020/0274251 A1* | 8/2020 | Sakamoto | H01Q 21/24 |
| 2020/0313305 A1* | 10/2020 | Yang | H01Q 21/0025 |

* cited by examiner

ANTENNA-IN-PACKAGE SYSTEM AND MOBILE TERMINAL

TECHNICAL FIELD

The present disclosure relates to the field of wireless communication technologies, and in particular, to an antenna-in-package system and a mobile terminal.

BACKGROUND

With 5G being the focus of research and development in the global industry, developing 5G technologies and formulating 5G standards have become the industry consensus. The ITU-RWP5D 22nd meeting held in June 2015 by International Telecommunication Union (ITU) identified three main application scenarios for 5G: enhance mobile broadband, large-scale machine communication, and highly reliable low-latency communication. These three application scenarios respectively correspond to different key indicators, and in the enhance mobile broadband scenario, the user peak speed is 20 Gbps and the minimum user experience rate is 100 Mbps. Currently, 3GPP is working on standardization of 5G technology. The first 5G Non-StandAlone (NSA) international standard was officially completed and frozen in December 2017, and the 5G StandAlone standard was scheduled to be completed in June 2018. Research work on many key technologies and system architectures during the 3GPP conference was quickly focused, including the millimeter wave technology. The high carrier frequency and large bandwidth characteristics unique to the millimeter wave are the main means to achieve 5G ultra-high data transmission rates.

The rich bandwidth resources of the millimeter wave band provide a guarantee for high-speed transmission rates. However, due to the severe spatial loss of electromagnetic waves in this frequency band, wireless communication systems using the millimeter wave band need to adopt an architecture of a phased array. The phases of respective array elements are caused to distribute according to certain regularity by a phase shifter, so that a high gain beam is formed and the beam is scanned over a certain spatial range through a change in phase shift.

With an antenna being an indispensable component in a radio frequency (RF) front-end system, it is an inevitable trend in the future development of the RF front-end to system-integrate and package the antenna with a RF front-end circuit while developing the RF circuit towards the direction of integration and miniaturization. The antenna-in-package (AiP) technology integrates, through package material and process, the antenna into a package carrying a chip, which fully balances the antenna performance, cost and volume and is widely favored by broad chip and package manufacturers. At present, companies including Qualcomm, Intel, IBM and the like have adopted the antenna-in-package technology. Undoubtedly, the AiP technology will also provide a good antenna solution for 5G millimeter wave mobile communication systems.

In the related antenna package technology, it is difficult to achieve a bandwidth above 10% in a fixed stacked structure in a limited space of the antenna-in-package system.

Therefore, it is indeed necessary to provide a new antenna-in-package system and a new mobile terminal to solve the above problems.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

The present disclosure will be further illustrated with reference to the accompanying drawings and the embodiments.

Figure 1:
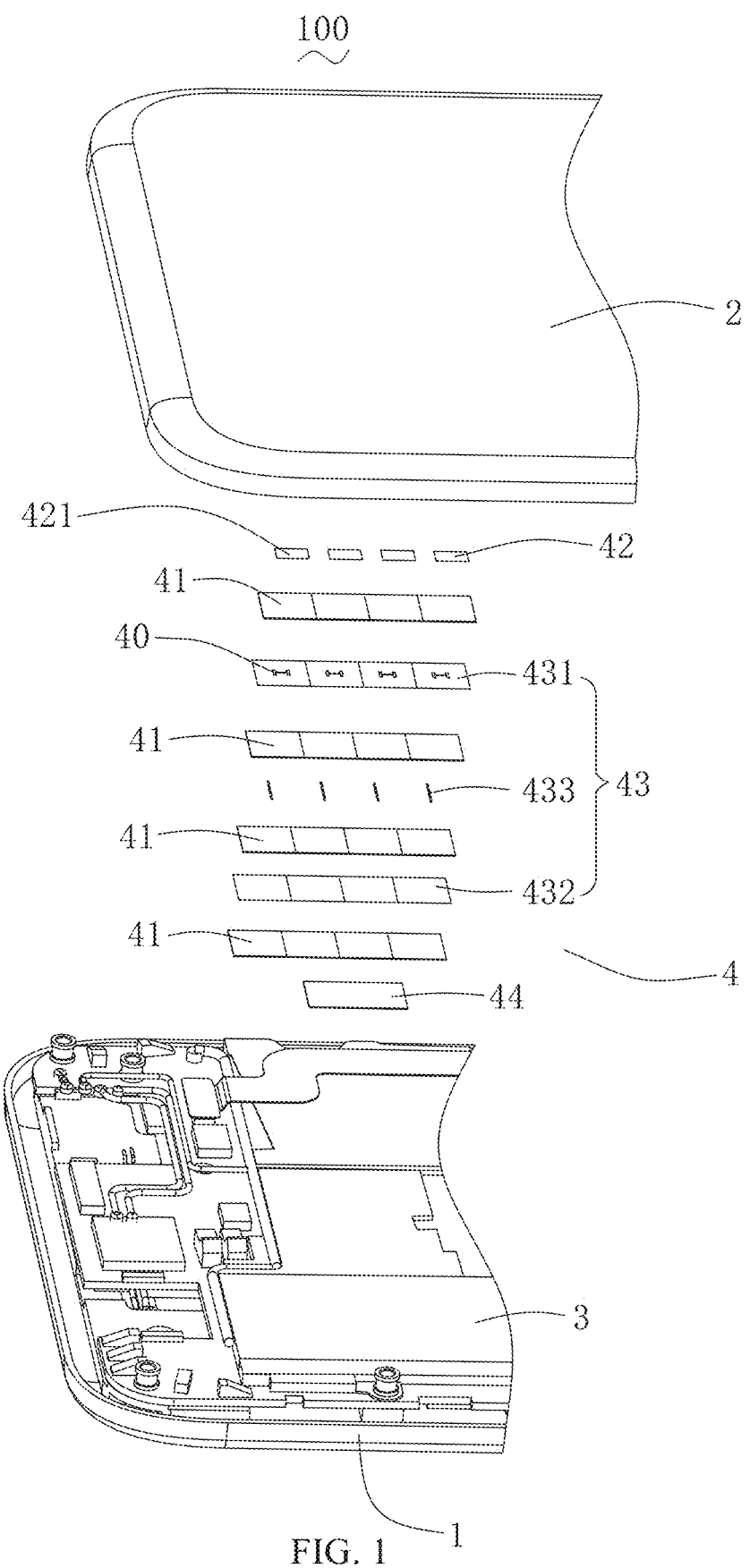
FIG. 1 is a perspective structural schematic diagram of a mobile terminal provided by the present disclosure.
Figure 2:
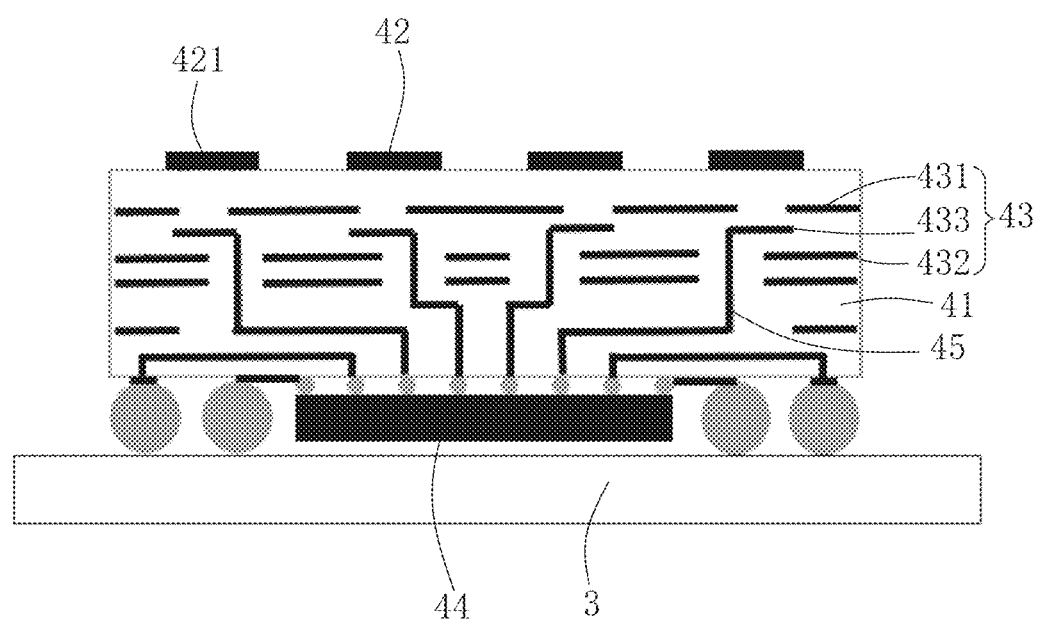
FIG. 2 is a plane structural schematic diagram of a partial structure of the mobile terminal shown in FIG. 1.
Figure 3:
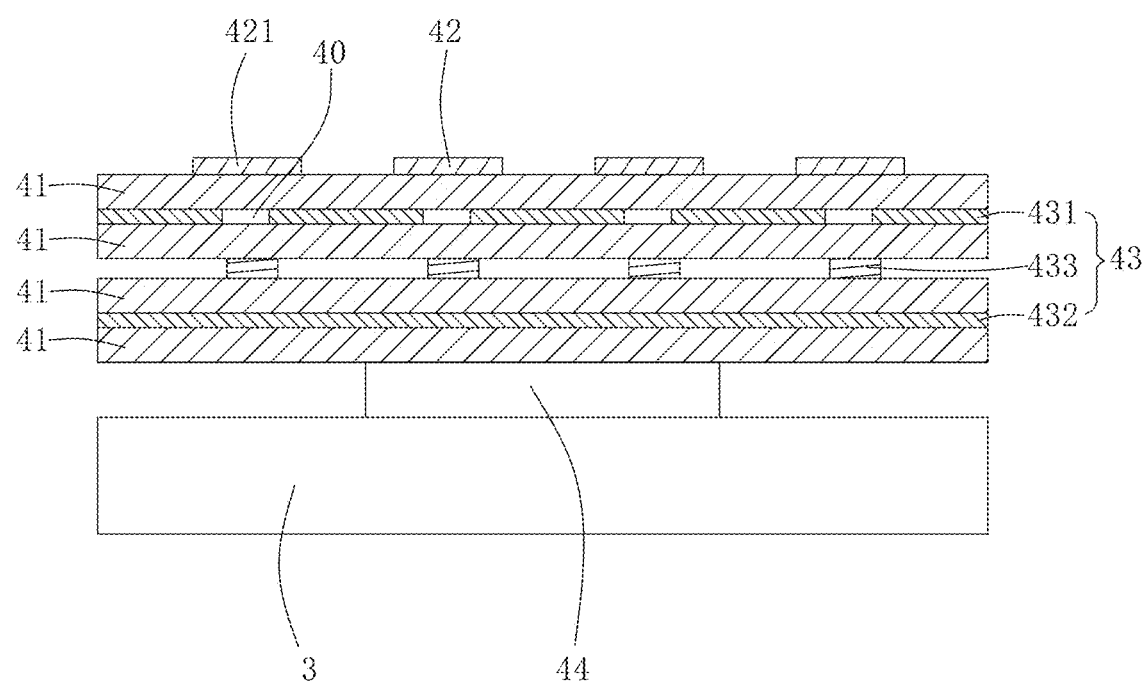
FIG. 3 is a hierarchical structure schematic diagram of a feeding network shown in FIG. 1.

As shown in FIGS. 1-3, the present disclosure provides a mobile terminal 100. The mobile terminal 100 may be a mobile phone, an ipad, a POS machine, etc., which is not limited by the present disclosure. The mobile terminal 100 includes a frame 1, a 3D glass back cover 2 covering and connected to the frame 1 and enclosing a receiving space with the frame 1, a main board 3 received in the receiving space and spaced apart from the 3D glass back cover 2, and an antenna-in-package system 4 electrically connected to the main board 3.

The 3D glass back cover 2 can cover and be connected to the frame 1 by an adhesive, or the frame 1 and the 3D glass back cover 2 may be respectively provided with a corresponding buckle structure, such that the 3D glass back cover 2 can be fixedly connected to the frame 1 by a buckling manner. Alternatively, the frame 1 and the 3D glass back cover may be formed into one piece. The 3D glass back cover 2 can provide better protection, aesthetics, thermal diffusion, color, and user experience.

The antenna-in-package system 4 can receive and transmit electromagnetic wave signals, thereby achieving the communication function of the mobile terminal 100. Specifically, the antenna-in-package system 4 can be connected to the main board 3 through BGA package technology.

The antenna-in-package system 4 is a millimeter wave phased array. Specifically, the antenna-in-package system 4 includes a substrate 41, a metal antenna 42 provided on a side of the substrate 41 facing away from the main board 3, a feeding network 43 provided in the substrate 41 and spaced apart from the metal antenna 42, an integrated circuit chip 44 provided on a side of the substrate 41 facing towards the main board 3, and a circuit 45 connecting the feeding network 44 with the integrated circuit chip 44.

The substrate 41 is used to carry other components of the antenna-in-package system 4. The substrate 41 may be formed as a whole or may be arranged by layers.

The metal antenna 42 may be selected from one of a square patch antenna, a ring patch antenna, a circular patch antenna, and a cross-shaped patch antenna. As an example, the metal antenna 42 may be a square patch antenna. Without doubt, in other embodiments, the metal antenna 42 may also use an antenna of other forms.

Further, the metal antenna 42 is a one-dimensional linear array, occupies a narrow space in the mobile phone, and is scanned only in one perspective, which simplifies design difficulty, test difficulty, and beam management complexity. As an example, the metal antenna 42 may be a linear array of 1×4, i.e., the metal antenna 42 includes four metal antenna units 421.

The feeding network 43 is a strip wire having impedance that is easy to control and having better shielding, which can effectively reduce the loss of electromagnetic energy and improve the antenna efficiency. The feeding network 43 includes a first metal layer 431 close to the metal antenna 42, a second metal layer 432 arranged opposite to and spaced apart from the first metal layer 431, and a stripe wire layer 433 sandwiched between the first metal layer 431 and the second metal layer 432.

The first metal layer 431 is provided with a slit 40 at a position corresponding to the metal antenna 42, and the feeding network 43 feeds power by coupling via the slit 40.

The number of the slits 40 matches the number of the metal antenna units 421 and each of the metal antenna units 421 is fed with power by coupling via the slit 40. Specifically, electromagnetic energy is coupled to the metal antenna unit 421 through the slit 40. In the present embodiment, the number of the slits 40 is four, and each of the slits 40 is provided corresponding to one of the metal antenna units 421.

Figure 4:
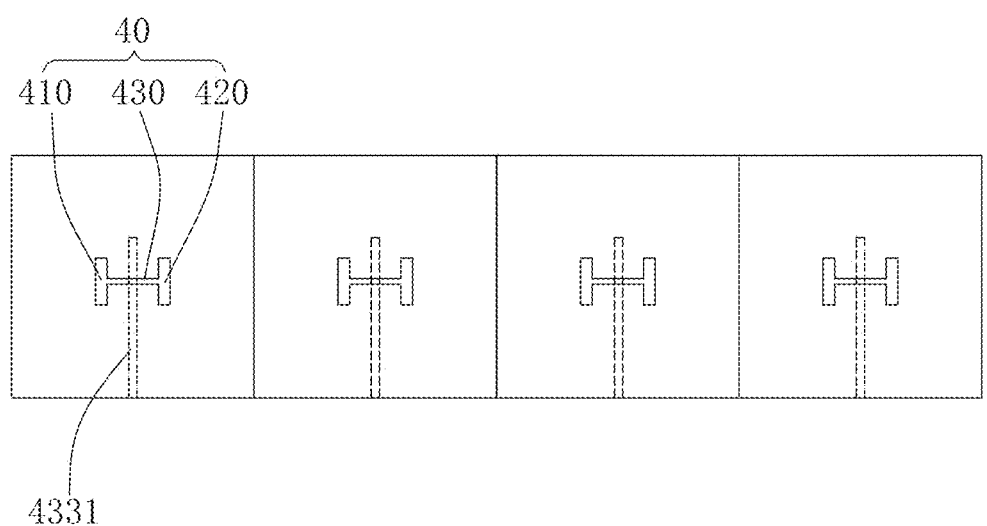
FIG. 4 is a front diagram of a feeding network shown in FIG. 1.

Referring to FIG. 4, in the embodiment, the slit 40 is in an I-shape. The slit 40 includes a first portion 410, a second portion 420 arranged in parallel with and spaced apart from the first portion 410, and a third portion 430 connecting the first portion 410 with the second portion 420. The first portion 410, the second portion 420, and the third portion 430 are all linear slits. Two ends of the third portion 430 are connected to centers of the first portion 410 and the second portion 420, respectively. The strip wire layer 433 includes an elongated transmission line 4331. An orthographic projection of the third portion 430 on the strip wire layer 433 intersects perpendicularly with the transmission line 4331. Orthographic projections of the first portion 410 and the second portion 420 on the strip wire layer 433 are located on two sides of the transmission line 4331 and symmetrical about the transmission line 4331.

In other embodiments, the shape of the slit 40 may also be square, annular, circular or triangular, which is not limited in the present disclosure.

Further, the orthographic projection of the slit 40 towards the metal antenna unit 421 completely falls within the range of the metal antenna unit 421.

The integrated circuit chip 44 is fixedly connected with the substrate 41 by the flip-chip bonding process.

Figure 5A:
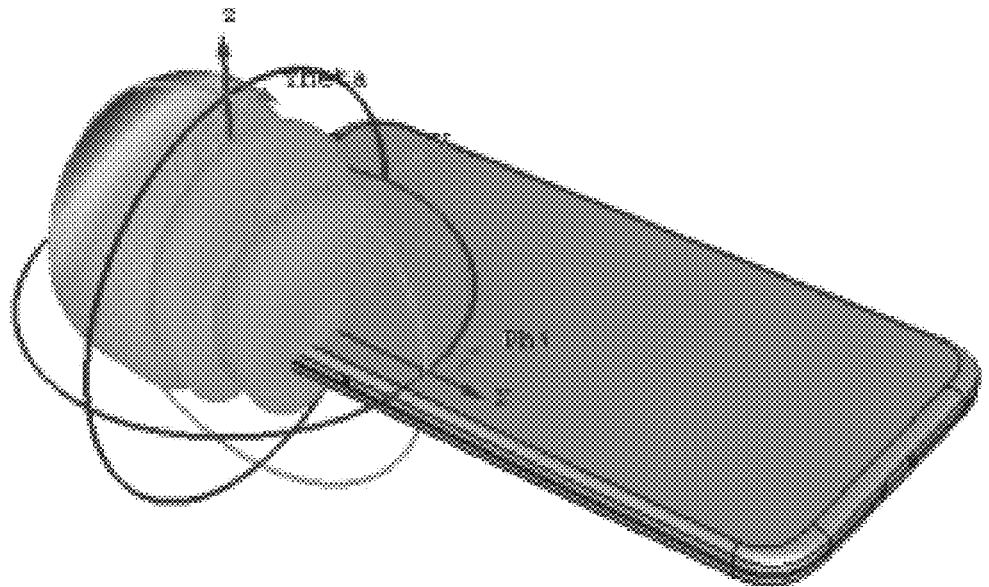
FIG. 5A illustrates a radiation pattern with a phase shift of each metal antenna unit being 45° in an antenna-in-package system provided by the present disclosure.
Figure 5B:
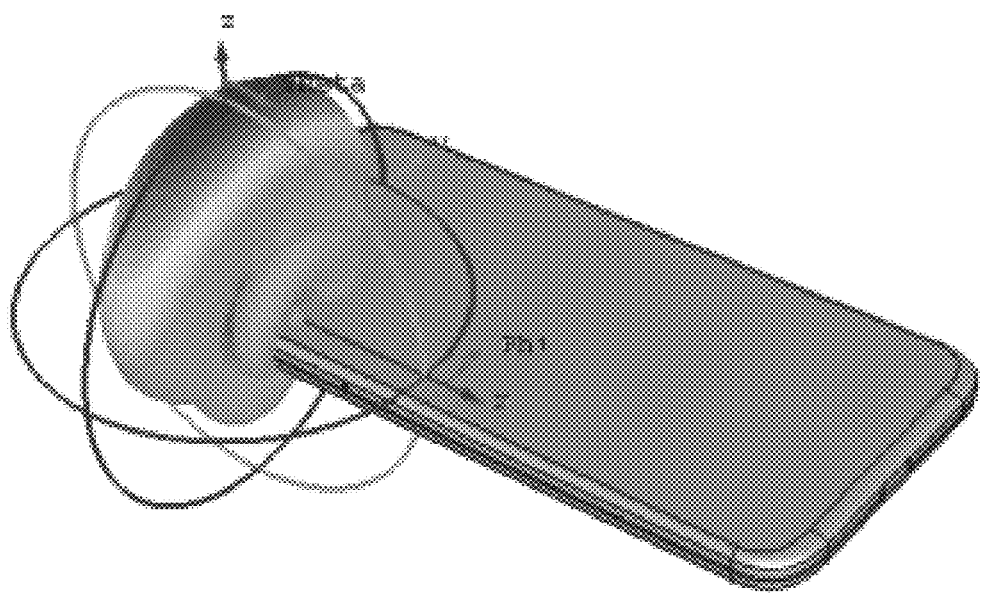
FIG. 5B illustrates a radiation pattern with a phase shift of each metal antenna unit being 0° in an antenna-in-package system provided by the present disclosure.
Figure 5C:
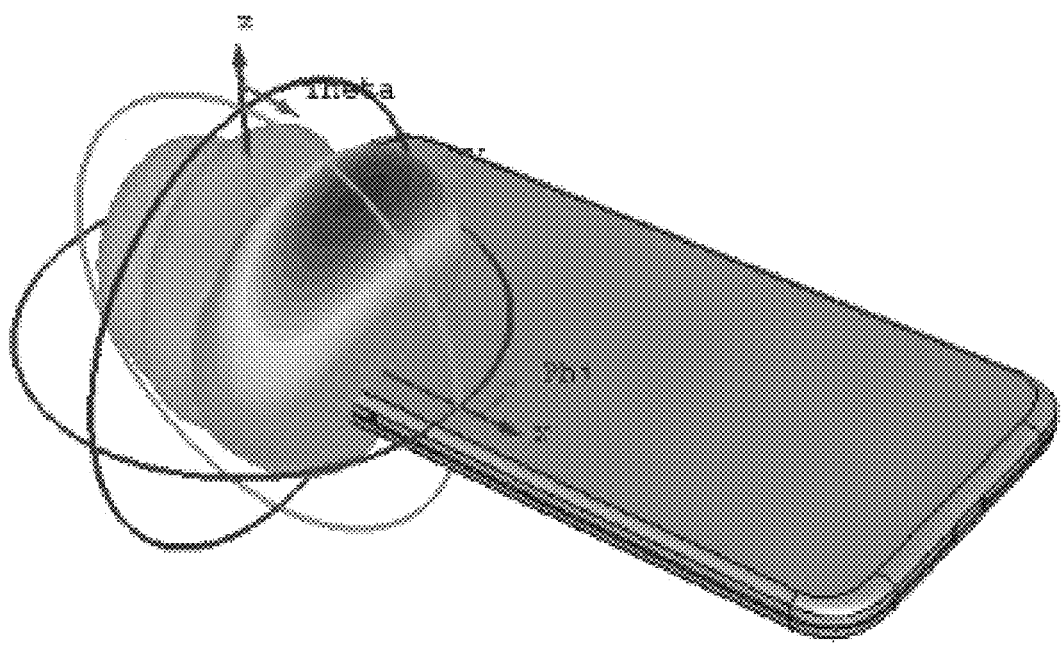
FIG. 5C illustrates a radiation pattern with a phase shift of each metal antenna unit being −45° in an antenna-in-package system provided by the present disclosure.
Figure 6:
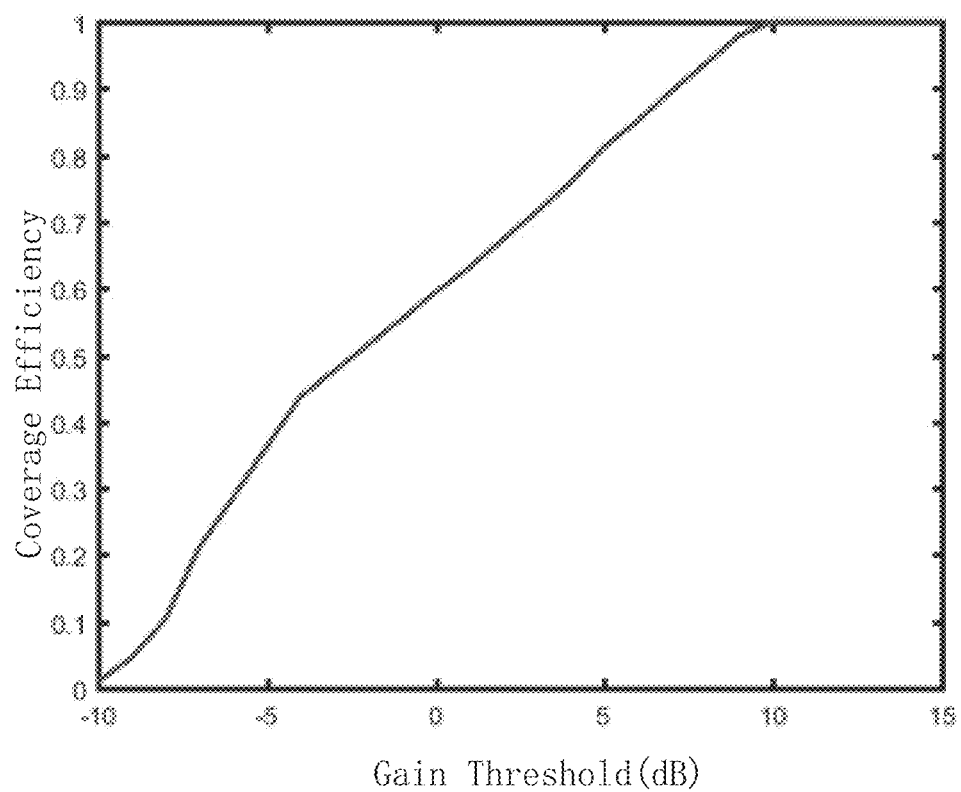
FIG. 6 illustrates a coverage efficiency graph of an antenna-in-package system provided by the present disclosure.

Referring to FIG. 5A to FIG. 6, FIG. 5A illustrates a radiation pattern with a phase shift of each metal antenna unit being 45° in the antenna-in-package system provided by the present disclosure, FIG. 5B illustrates a radiation pattern with a phase shift of each metal antenna unit being 0° in the antenna-in-package system provided by the present disclosure, FIG. 5C illustrates a radiation pattern with a phase shift of each metal antenna unit being −45° in the antenna-in-package system provided by the present disclosure, and FIG. 6 illustrates a coverage efficiency graph of an antenna-in-package system provided by the present disclosure. As can be seen from FIG. 6, in the case where the coverage efficiency is 50%, the gain threshold of the antenna-in-package system 4 is reduced by 12.4 dB, while in the 3GPP discussion, the gain threshold is reduced by 12.98 dB for the case of 50% coverage efficiency, showing that the antenna-in-package system 4 of the present disclosure has the better coverage efficiency.

Compared with the packaged antenna in the related art, the antenna-in-package system 4 in the present embodiment is formed by stacking using a PCB process or an LTCC process, and achieves a larger antenna impedance bandwidth of at the same thickness by feeding the metal antenna 42 with power by coupling with the feeding network 43. Taking an impedance bandwidth of n257 (26.5-29.5 GHz) band of the 5G communication as an example, the bandwidth is expanded by 50% compared with the conventional feeding mode.

What has been described above is only an embodiment of the present disclosure, and it should be noted herein that one ordinary person skilled in the art can make improvements without departing from the inventive concept of the present disclosure, but these are all within the scope of the present disclosure.

What is claimed is:

1. An antenna-in-package system applied to a mobile terminal comprising a main board, the antenna-in-package system comprising:
   a substrate arranged opposite to the main board;
   a metal antenna provided on a side of the substrate facing away from the main board;
   an integrated circuit chip provided on a side of the substrate facing towards the main board;
   a feeding network provided in the substrate and spaced apart from the metal antenna; and
   a circuit connecting the feeding network with the integrated circuit chip, the circuit being electrically connected to the main board,
   wherein the feeding network is provided with at least one slit at a position corresponding to the metal antenna, and the metal antenna is fed with power by coupling via the at least one the slit;
   wherein the antenna-in-package system is a millimeter wave phased array antenna system;
   wherein the feeding network is a strip wire and comprises a first metal layer close to the metal antenna, a second metal layer arranged opposite to and spaced apart from the first metal layer, and a strip wire layer sandwiched between the first metal layer and the second metal layer, the strip wire layer being spaced apart from the first metal layer and the second metal layer, the stripe wire layer comprising an elongated transmission line, and the at least one slit being provided in the first metal layer.

2. The antenna-in-package system as described in claim 1, wherein each of the at least one slit comprises a first portion, a second portion arranged in parallel with and spaced apart from the first portion, and a third portion connecting the first portion with the second portion, all of the first portion, the second portion and the third portion are linear slits, and two ends of the third portion are respectively connected to centers of the first portion and the second portion.

3. The antenna-in-package system as described in claim 2, wherein the metal antenna is a one-dimensional linear array and comprising a number of metal antenna units, the at least one slit comprising a number of slits matching the number of the metal antenna units, and each of the metal antenna units is fed with power by coupling via its corresponding one of the number of slits.

4. The antenna-in-package system as described in claim 3, wherein an orthographic projection of each of the number of slits towards a direction of its corresponding the metal antenna unit is completely located within a range of the metal antenna unit.

5. The antenna-in-package system as described in claim 3, wherein an orthographic projection of the third portion on the strip wire layer intersects perpendicularly with the transmission line, and orthographic projections of the first portion and the second portion on the strip wire layer are located on two sides of the transmission line and symmetrical about the transmission line.

6. The antenna-in-package system as described in claim 1, wherein the metal antenna is selected from a group consisting of a square patch antenna, a ring patch antenna, a circular patch antenna or a cross patch antenna.

7. The antenna-in-package system as described in claim 1, wherein a surface of the metal antenna is coated with a protective film.

8. A mobile terminal, comprising the antenna-in-package system as described in claim 1.

\* \* \* \* \*